(12) United States Patent
Norwood et al.

(10) Patent No.: US 8,940,267 B2
(45) Date of Patent: Jan. 27, 2015

(54) METHOD OF PURIFYING NANODIAMOND POWDER AND PURIFIED NANODIAMOND POWDER

(75) Inventors: Robert A. Norwood, Tucson, AZ (US); Palash Gangopadhyay, Tucson, AZ (US); Alexander Ashton Miles, Tucson, AZ (US); Jun Kato, Yokohama (JP); Shabnam Virji-Khalfan, Yorba Linda, CA (US); Mamoru Miyawaki, Tucson, AZ (US)

(73) Assignees: The Arizona Board of Regents on Behalf of the University of Arizona, Tucson, AZ (US); Canon Kabushiki Kaisha, Tokyo (JP)

( * ) Notice: Subject to any disclaimer, the term of this patent is extended or adjusted under 35 U.S.C. 154(b) by 164 days.

(21) Appl. No.: 13/536,502

(22) Filed: Jun. 28, 2012

(65) Prior Publication Data

US 2014/0004031 A1    Jan. 2, 2014

(51) Int. Cl.
| | | |
|---|---|---|
| B01J 3/06 | (2006.01) | |
| C09C 1/56 | (2006.01) | |
| C01B 31/02 | (2006.01) | |
| C01B 31/06 | (2006.01) | |
| C30B 29/04 | (2006.01) | |
| C30B 25/16 | (2006.01) | |
| C30B 25/00 | (2006.01) | |

(52) U.S. Cl.
CPC .............. *C01B 31/065* (2013.01); *C01B 31/06* (2013.01); *C30B 29/04* (2013.01); *C30B 25/00* (2013.01); *C30B 25/165* (2013.01); *C30B 25/16* (2013.01); *Y10S 977/895* (2013.01); *Y10S 977/775* (2013.01)

USPC .......... 423/446; 423/460; 423/461; 977/895; 977/775

(58) Field of Classification Search
CPC combination set(s) only.
See application file for complete search history.

(56) References Cited

U.S. PATENT DOCUMENTS 5,133,792 A * 7/1992 Purohit et al. .................. 134/26

FOREIGN PATENT DOCUMENTS

| JP | 63-303806 | 12/1988 |
| JP | 03271109 A * | 12/1991 |
| JP | 2011-037693 | 2/2011 |
| RU | 2446097 C1 * | 9/2010 |
| WO | 2007/133765 A2 | 11/2007 |

OTHER PUBLICATIONS

Petrov et al.; Detonation Nanodiamonds Simultaneously Purified and Modified by Gas Treatment; Diamond & Related Materials; 16, 2098-2103; 2007.*
Shenderova et al.; Modification of Detonation Nanodiamonds by Heat Treatment in Air; Diamond & Related Materials; 1799-1803; 2006.*

(Continued)

*Primary Examiner* — Guinever Gregorio
(74) *Attorney, Agent, or Firm* — Canon U.S.A., Inc. IP Division (57) ABSTRACT

A method of purifying a nanodiamond powder includes preparing the nanodiamond powder, heating the nanodiamond powder at between 450° C. and 470° C. in an atmosphere including oxygen, performing a hydrochloric acid treatment on the heated nanodiamond powder, and performing a hydrofluoric acid treatment on the nanodiamond powder obtained after performing the hydrochloric acid treatment.

10 Claims, 10 Drawing Sheets

(56) References Cited

OTHER PUBLICATIONS

V. Pichot et al., An efficient purification method for detonation nanodiamonds, Diamond & Related Materials 17 (2008) 13-22.

Sebastian Osswald et al., Control of sp2/sp3 Carbon Ratio and Surface Chemistry of Nanodiamond Powders by Selective Oxidation in Air, J. Am. Chem. Soc. 2006, 128, 11635-11642.

Roberto Martin et al., Fenton-Treated Functionalized Diamond Nanopartides as Gene Delivery System, www.acsnano.org vol. 4, No. 1, 65-74, 2010.

Kristopher D. Behler et al., Nanodiamond-Polymer Composite Fibers and Coatings, www.acsnano.org, vol. 3, No. 2, 363-369, 2009.

* cited by examiner

METHOD OF PURIFYING NANODIAMOND POWDER AND PURIFIED NANODIAMOND POWDER

BACKGROUND OF THE INVENTION

1. Field of the Invention

The present invention relates to a method of purifying nanodiamond powder and highly-purified nanodiamond powder.

2. Description of the Related Art

Nanodiamonds are used as abradants because of their hardness, and they can also be used as an insulating material, an optical material, and a biomedical material.

In WO2007/133765, Gogotsi, et al. disclosed an oxidization process to remove $sp^2$ carbon from commercially available nanodiamond powder. However, a small percentage of $sp^2$ carbon can still be detected after the oxidization process. In addition to the removal of $sp^2$ carbon, metal impurities might be an issue when the nanodiamonds are used as an optical or biomedical material.

SUMMARY OF THE INVENTION

Embodiments of the present invention provide an apparatus and a method for nanodiamond purification.

According to an aspect of the present invention, a purification method of a nanodiamond powder is provided that includes preparing the nanodiamond powder, heating the nanodiamond powder at between 450° C. and 470° C. in an atmosphere including oxygen, performing a hydrochloric acid treatment to the heated nanodiamond powder, and performing a hydrofluoric acid treatment to the nanodiamond powder obtained after performing the hydrochloric acid treatment.

According to another aspect of the present invention, a nanodiamond powder is provided having $sp^3$ carbon, wherein the content of S (sulfur), Fe (iron), Al (aluminum), and Si (silicon) in the powder is each less than 0.01 wt %.

Further features of the present invention will become apparent from the following description of exemplary embodiments with reference to the attached drawings.

DESCRIPTION OF THE EMBODIMENTS

Figure 1:
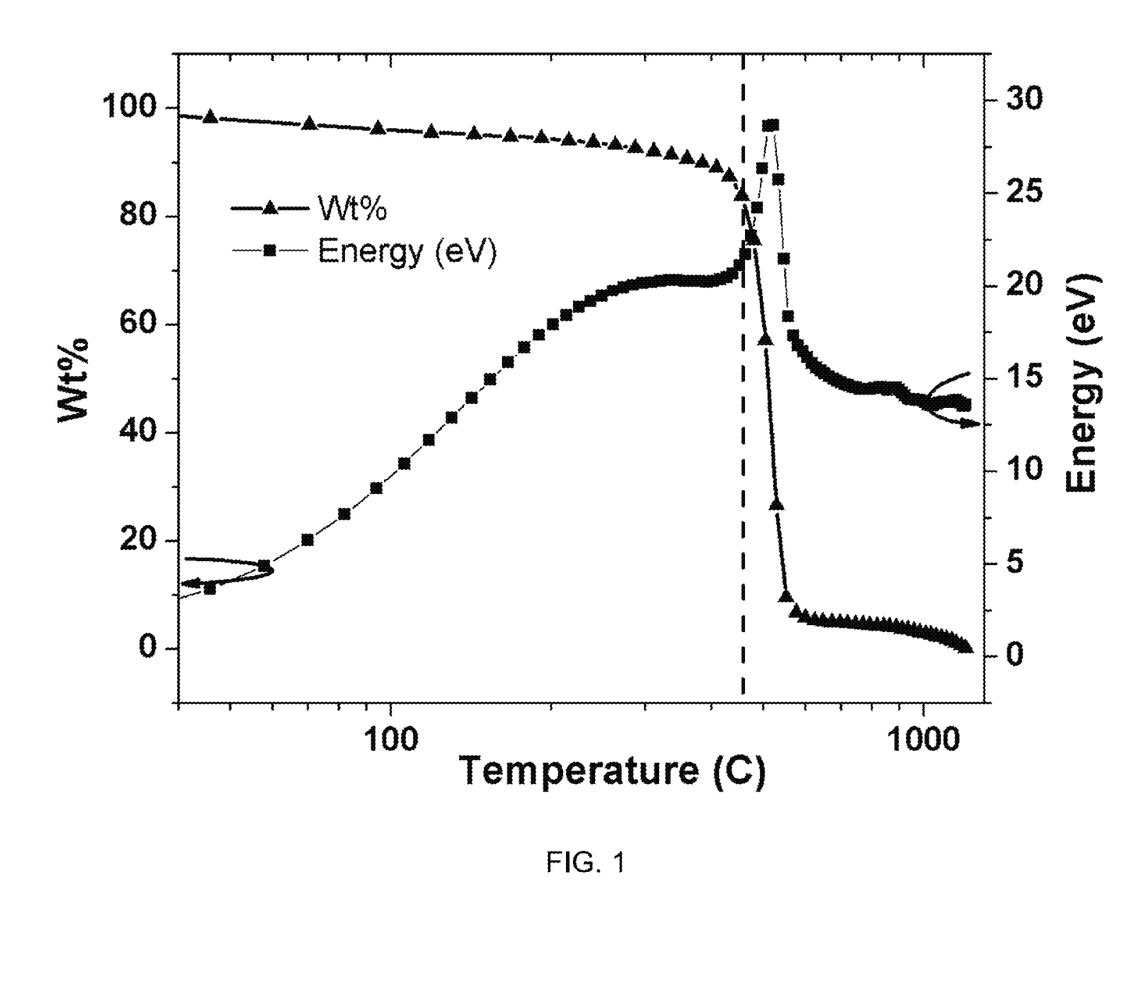
FIG. 1 shows a thermogravimetric analysis (TGA) spectrum of a nanodiamond powder before oxidation.

According to aspects of the invention, a purification method for purifying nanodiamond powder can include the following three steps. The first step is a heating step to oxidize carbon impurities ($sp^2$ carbon) in order to remove them from a nanodiamond powder. The heating can be executed in an atmosphere including oxygen. The atmosphere can be an air, or an oxygen gas. The temperature of the heating can be selected from between 450° C. and 470° C. For example, the powder can be heated at 460° C. FIG. 1 shows the TGA spectrum of as-purchased nanodiamond powder. The oxidation process onsets at about 460° C. (indicated as a dashed line) in this spectrum, as evident from the radiated thermal energy peak.

When a purchased nanodiamond powder substantially doesn't have $sp^2$ carbon before the first step, the heating step can be omitted.

The second step is to remove metal impurities, especially transition metals, from the nanodiamond powder after the oxidization process. To remove the metal impurities, a hydrochloric acid can be used. Hydrochloric acid may provide a high reaction rate with the transition metals. The hydrochloric acid may be provided as a solution of from 10% to 38.5% by weight of hydrochloric acid, such as a solution of 37% by weight hydrochloric acid. Hydrobromic and hydroiodic acids might also be used instead of using the hydrochloric acid.

The third step is to remove other impurities, such as silicon, silicon dioxide, aluminum, and aluminum silicate. To execute the third step, a hydrofluoric acid can be used. The hydrofluoric acid may be provided as a solution of from 4% to 48% by weight of hydrofluoric acid, such as a solution of 47% by weight hydrofluoric acid.

After the third step, a density gradient technique can be executed in order to classify the nanodiamonds, optionally. The density gradient technique allows for separation of the purified nanodiamonds on the basis of density, which may provide separation of nanodiamond materials according to particle size and/or number of particle clusters. According to one embodiment of a density gradient technique, a linear density gradient can be prepared using 60% OptiPrep™ (a commercially available density gradient solution comprising a solution of iodixanol) in distilled water, with relative densities of 60%, 50%, 40%, 30%, and 20%. One beaker is prepared for each ratio and stirred for 15 minutes to ensure good mixing. 14 ml of each in order of decreasing density are carefully added to a 70 ml centrifuge tube via syringe. The resulting structure is centrifuged at 3500 rpm for 20 minutes in order to linearize the density within the tube. A sample of centrifuged nanodiamond, possessing both a blue layer and a gray bulk material, is agitated in deionized water and 1 gram sodium cholate surfactant. The mixture is then sonicated and injected into the linear density gradient which is centrifuged at 3500 rpm for 99 minutes. The small amount of material spreads out to form a large cloud, and liquid is extracted from three regions within the density gradient and centrifuged separately. The isolated solid is collected and dissolved in a small amount of deionized water. Each of the solids collected from the extracted regions of the density gradient can be further classified according to one or more of color, particle size and particle cluster size, among other features, as discussed in further detail below.

Example 1

Nanodiamond powder can be produced via a detonation synthesis, and also commercially obtained.

Step I: Isothermal Treatment

An example of an isothermal treatment procedure is as follows. As-purchased nanodiamond powder (1.57 g) was placed in an oven at 460° C. for 1 hr. After removing it from the oven, the resulting powder was cooled down to room temperature to give ND_Iso460-1hr as a light gray powder (1.43 g, 91% yield).

Isothermal cleaning at 460° C. for approximately 1 hr effectively removes $sp^3$ carbon that is present in the purchased powder. The level of $sp^3$ carbon has primarily been estimated by electron energy loss spectroscopy (EELS), where spectral features are observed associated with $sp^3$ carbon (at ~285 eV) and $sp^a$ carbon (at about ~294 eV). The EELS spectra can be recorded using a scanning transmission electron microscope (JEOL 2010F), operated at 200 kV, equipped with TEM/STEM and Gatan high-resolution GIFT EELS detectors.

Figure 2A:
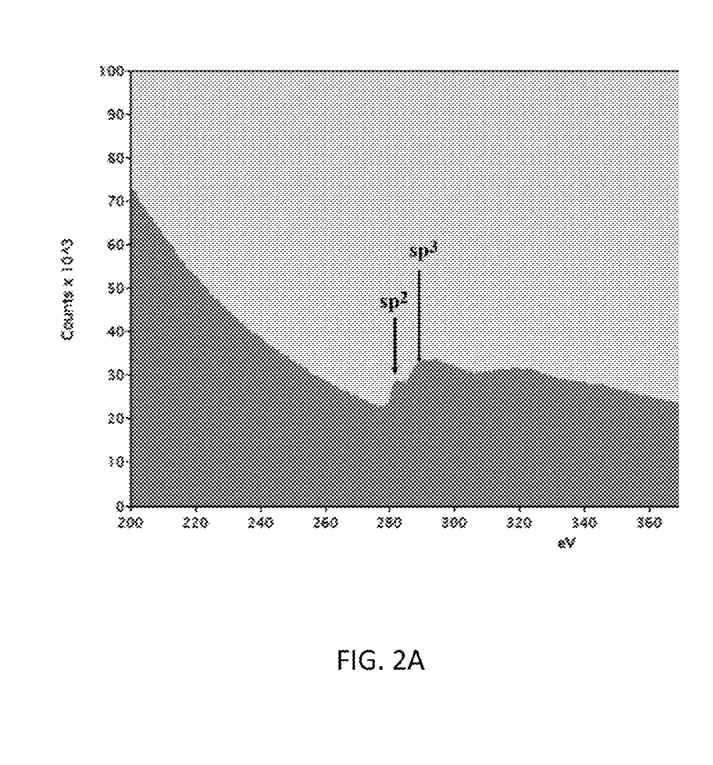
FIGS. 2A and 2B show electron energy loss spectroscopy (EELS) spectra of a nanodiamond powder before and after heat treatment, respectively.
Figure 2B:
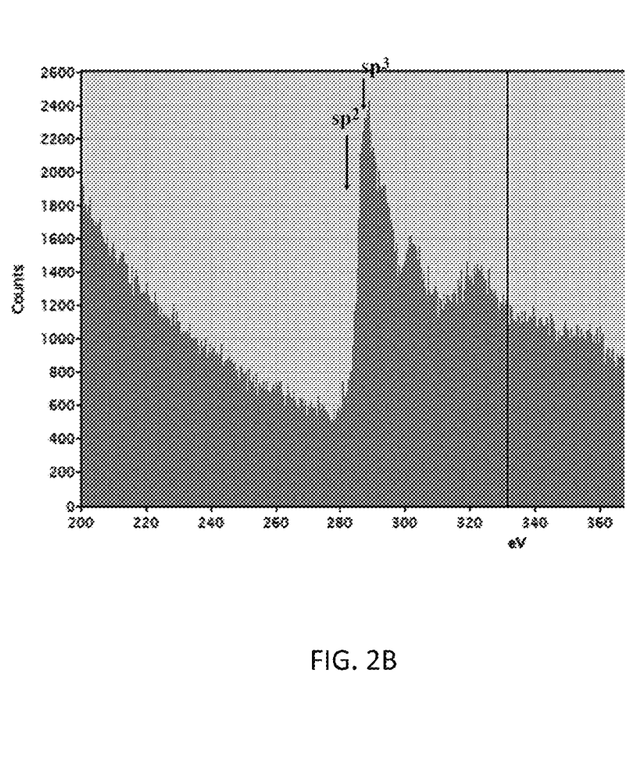

As an example, FIGS. 2A and 2B show the EELS spectra for the nanodiamond powder, before and after the isothermal treatment, respectively. According to FIGS. 2A and 2B, it is observed that $sp^2$ carbon substantially doesn't exist in the powder after isothermally heating the $sp^2$ carbon. When a purchased nanodiamond powder substantially doesn't have $sp^2$ carbon before the isothermal cleaning step, this step can be omitted.

After the isothermal treatment, the content of $sp^2$ carbon was found to be less than 0.01 wt %, as determined from high resolution EELS maps obtained after isothermal treatment.

Figure 5:
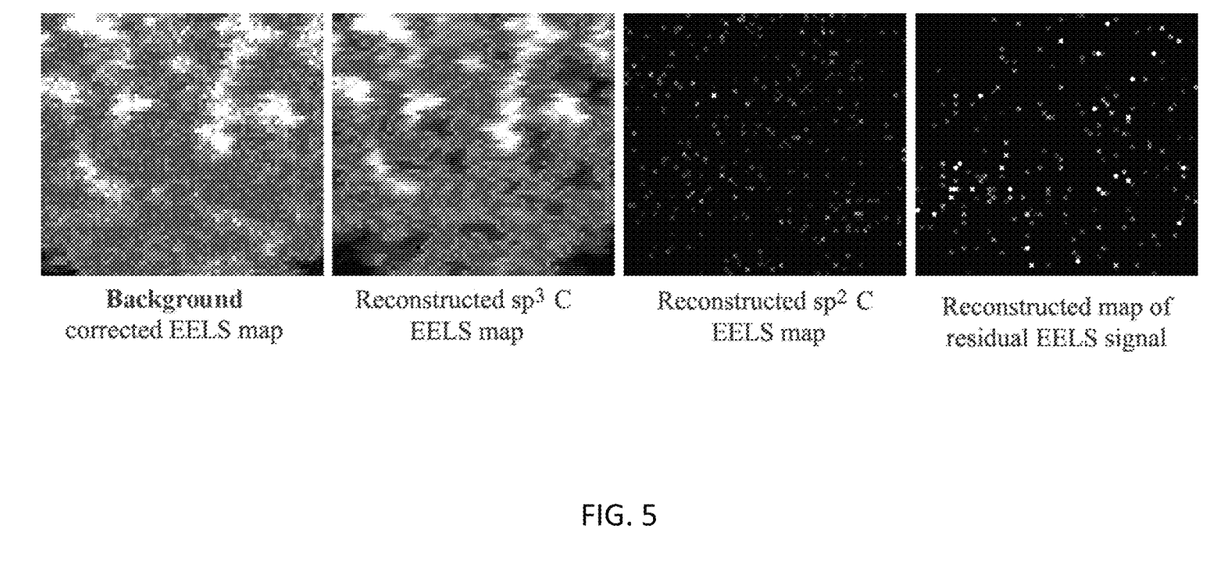
FIG. 5 shows EELS maps recorded on nanodiamond powder after heat treatment.

FIG. 5 shows EELS maps recorded on isothermally cleaned nanodiamond powder. Using GATAN EELS analysis software the concentration of $sp^3$ C was calculated as 2042±125 atoms/nm$^3$, which corresponds to 3.39±0.21 g/cm$^3$, comparable to diamond density of 3.515 g/cm$^3$. Similar measurements over the reconstructed $sp^2$ map over 284-290 eV yields a $sp^2$ concentration $4.6 \times 10^{-4}$ atoms/nm$^2$ with residual map density of ~$10^{-3}$ atoms/nm$^2$. Assuming the residual map density as the measurement noise level, it is concluded that the $sp^2$ C/$sp^3$ C ratio is ~$5 \times 10^{-7}$, which corresponds to less than 0.01 wt % of $sp^2$ carbon.

Step II: Hydrochloric Acid Treatment

An example of an HCl treatment procedure is as follows. The nanodiamond powder (1.21 g) obtained after the isothermal treatment was placed in 30 mL of 37% hydrochloric acid. The mixture was heated to 120° C. with stirring for 1 hr. After heating at 120° C. for 1 hr, the resulting suspension was poured into 200 mL of deionized water. The suspension was allowed to settle overnight to precipitate sufficient nanodiamond. The supernatant was removed gently. The remaining precipitate was repeatedly rinsed with deionized water until reaching the same pH as deionized water, and dried overnight at 100° C. in vacuo to give ND_Iso460-1hr_HCl-1hr as a light gray powder (0.91 g, 75% yield).

Step III: Hydrofluoric Acid Treatment

An example of an HF cleaning treatment procedure was performed as follows. Nanodiamond powder (0.20 g) yielded from the above HCl treatment was placed in 10 mL of 47-51% hydrofluoric acid. The mixture was stirred at room temperature for 80 min before the resulting suspension was poured into 200 mL of deionized water. This suspension was allowed to settle for 3 hours to precipitate sufficient nanodiamond. The supernatant was removed gently. The remaining precipitate was repeatedly rinsed vigorously with deionized water until reaching the same pH as deionized water, and dried overnight at 100° C. in vacuo to give ND_Iso460-1hr_HCl-1hr_HF-80min as a light gray powder (0.15 g, 75% yield). Plastic labware was used here instead of laboratory glassware, due to the corrosive effects of HF.

Energy dispersive X-ray (EDAX) analysis is a technique that can be performed with a scanning electron microscope and can provide quantitative information on the elements present in a given field of view. For each sample, eleven fields (50 μm×50 μm) were analyzed. The EDAX spectra were observed with the Hitachi S-3400 and S-4800. $K_\alpha$* energies between 0 and 11 keV were measured, which covers the majority of elements in the periodic table combining $L\alpha$ and $k\alpha$ peaks.

Figure 3A:
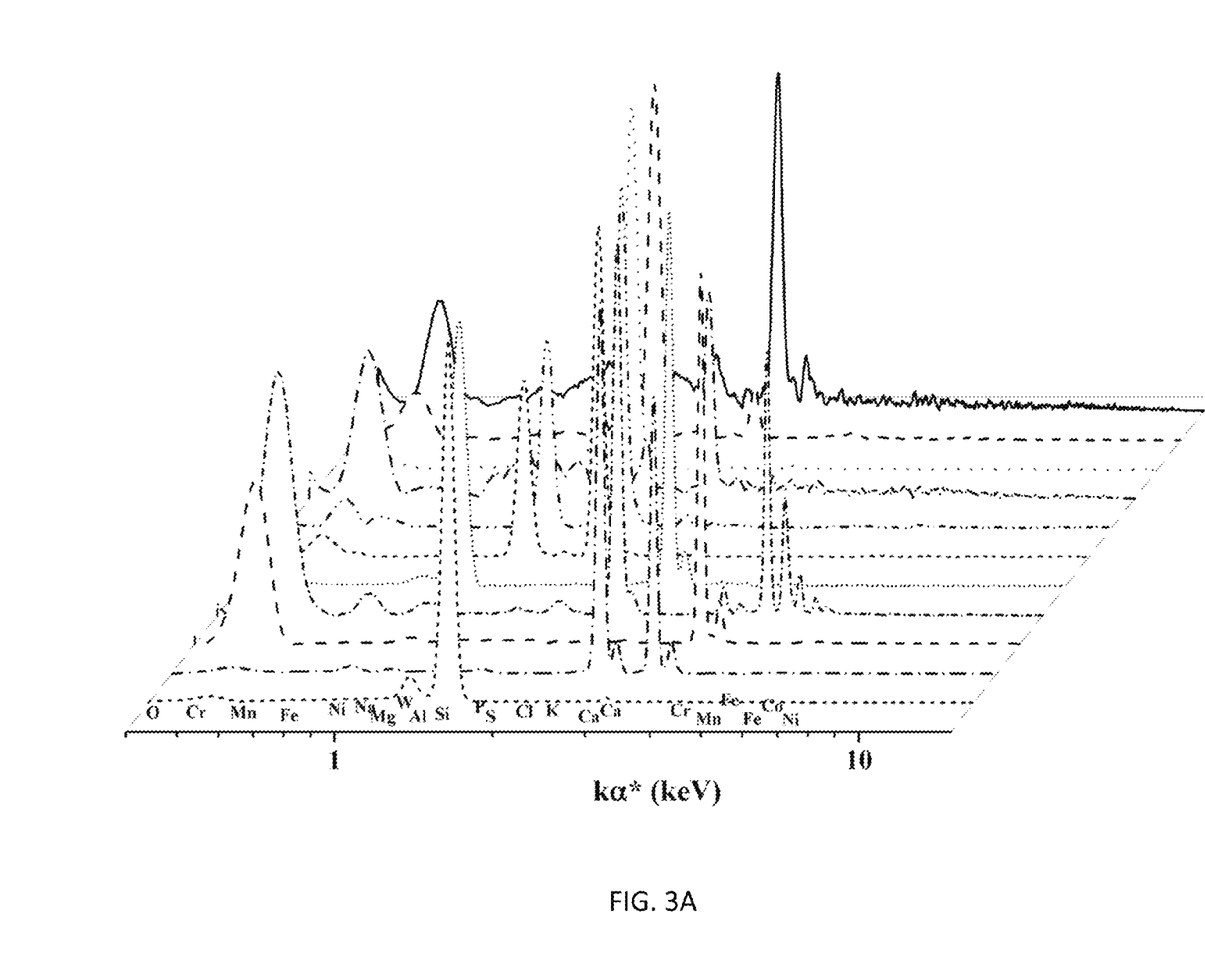
FIGS. 3A, 3B, 3C, and 3D show energy dispersive x-ray spectroscopy (EDAX) spectra of a nanodiamond powder at different steps in a purification process, and each curve shows a different measurement point in the same sample.

FIG. 3A shows EDAX spectra of nanodiamonds as-purchased. The horizontal line is energy in kiloelectron volts (keV), and the vertical line (not shown) is relative intensity.

The primary peak positions of S (sulfur), W (tungsten), Ta (tantalum), Fe (iron), Cr (chromium), Mn (manganese), Al (aluminum), Ag (silver), Ca (calcium), Cu (copper), Ti (titanium), Si (silicon), and Cl (chlorine) are 2.307 (S), 1.774 and 8.396 (W), 1.709 and 8.145 (Ta), 0.705 and 6.403 (Fe), 0.573 and 5.414 (Cr), 0.637 and 5.898 (Mn), 1.486 (Al), 2.984 (Ag), 0.341 and 3.691 (Ca), 0.930 and 8.040 (Cu), 0.452 and 4.510 (Ti), 1.740 (Si), 2.622 (Cl), respectively.

Figure 3B:
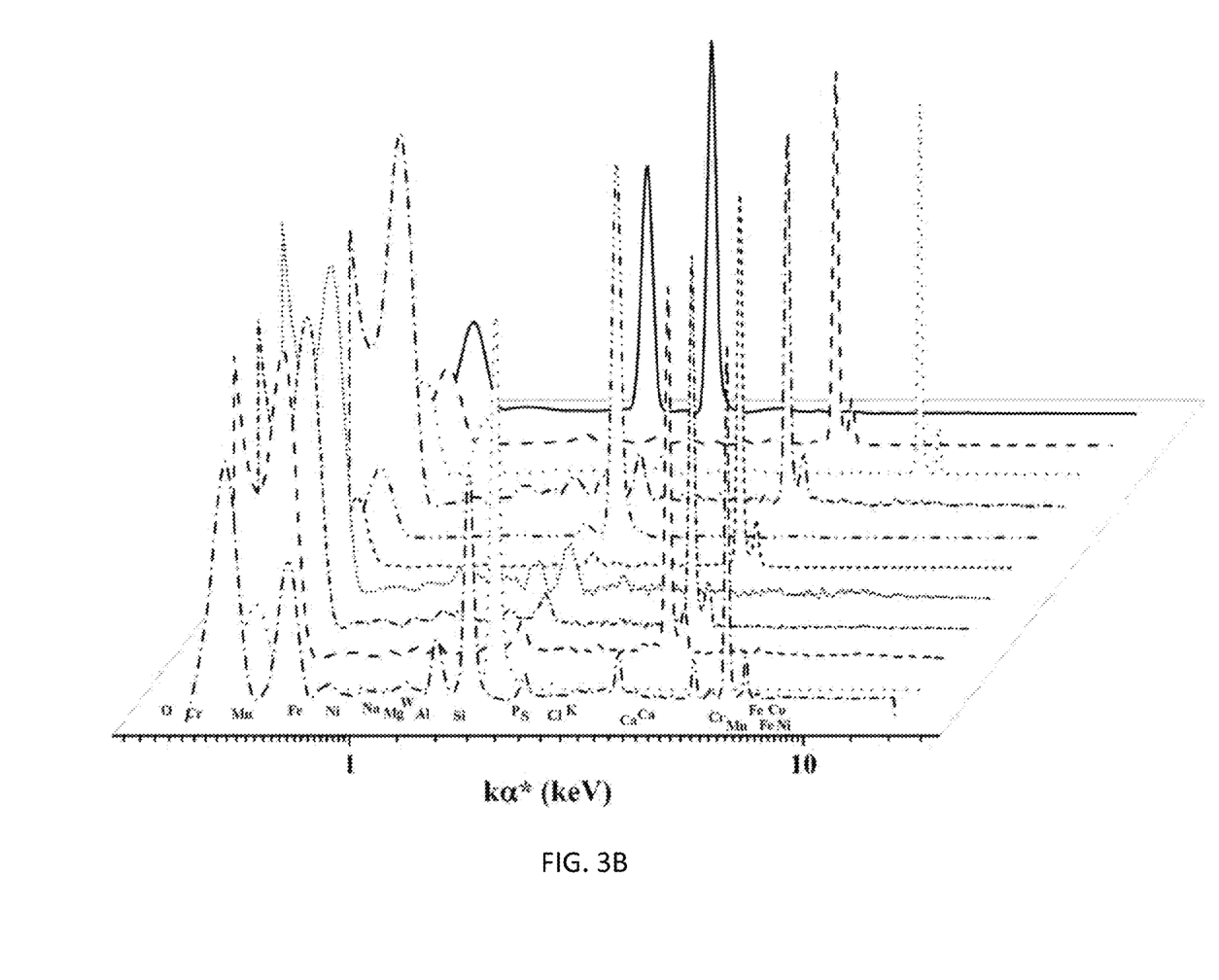
Figure 3C:
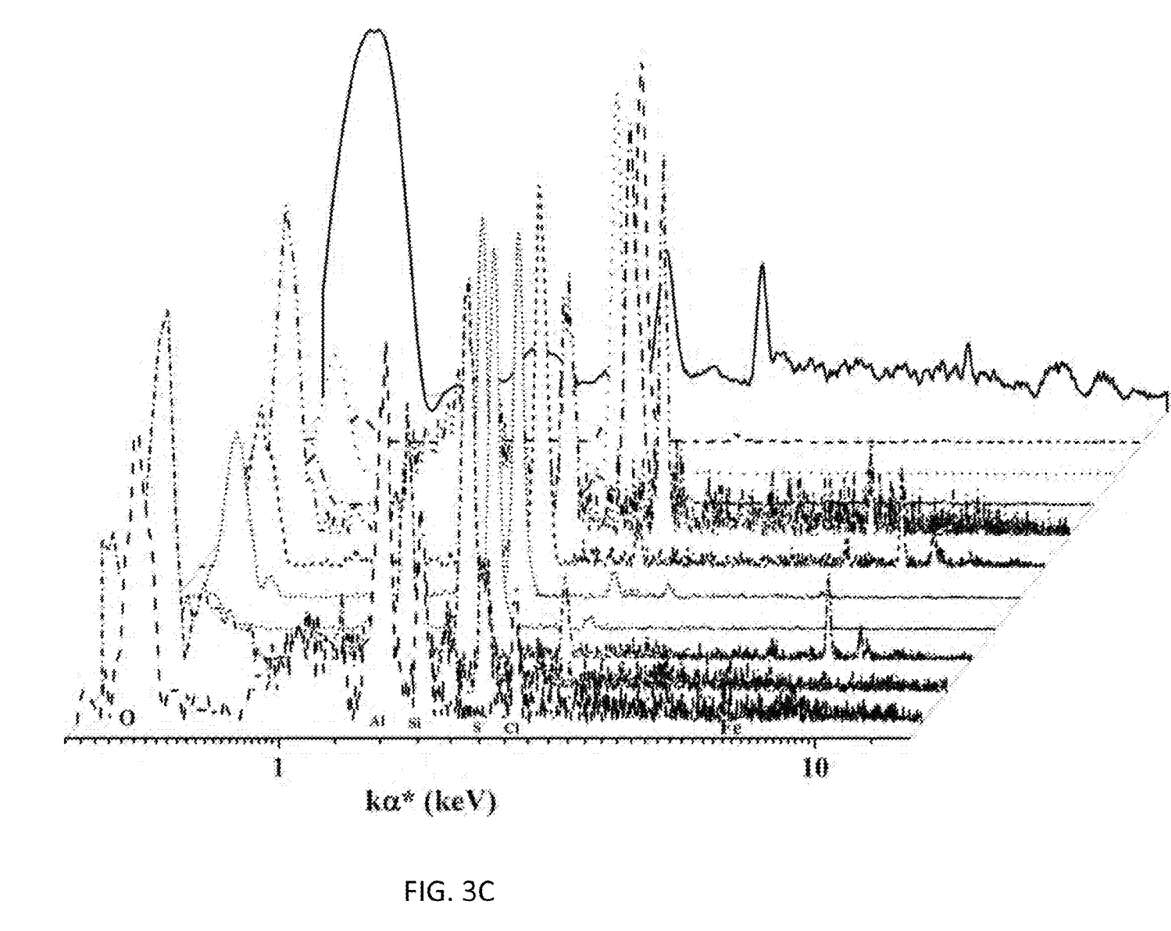
Figure 3D:
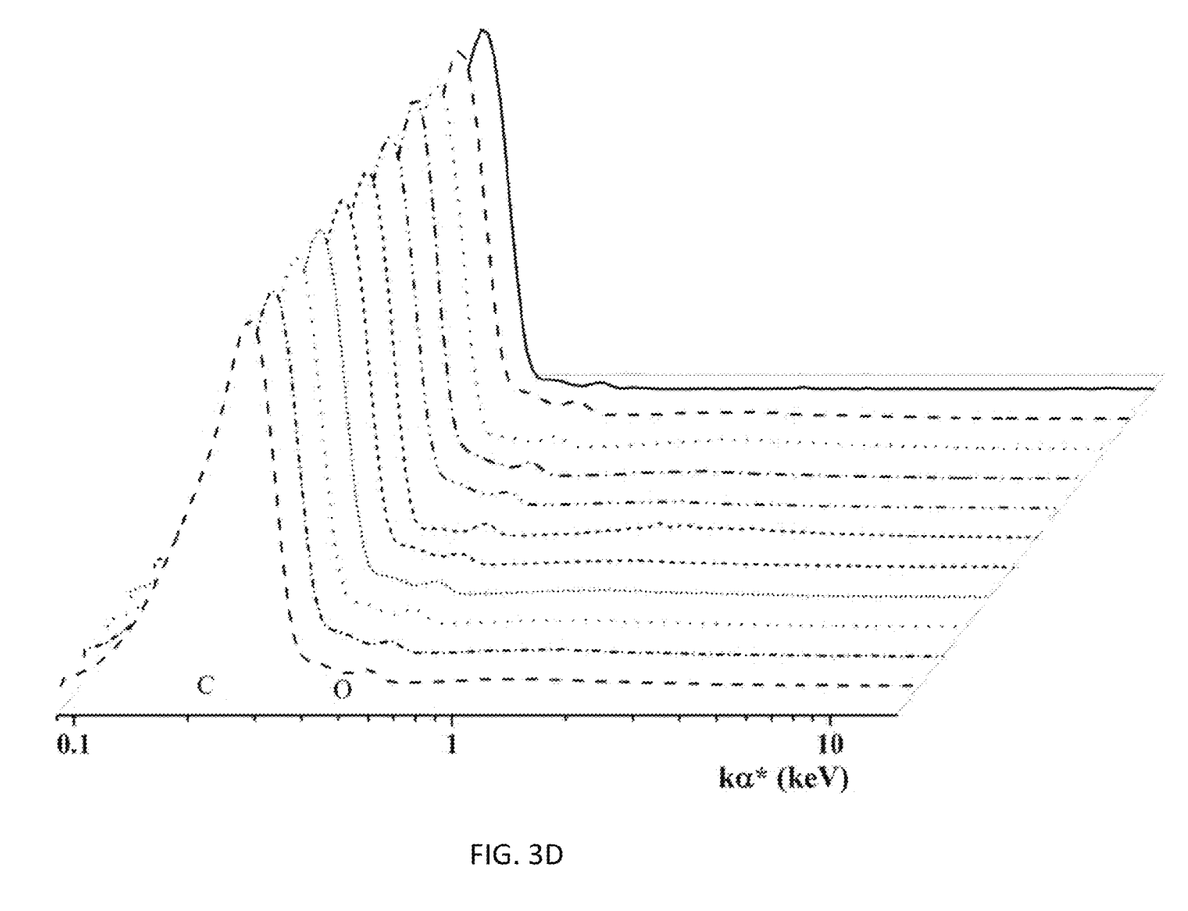

FIGS. 3B through 3D show nanodiamond EDAX spectra after the each of the purification steps, namely isothermal treatment, hydrochloric acid treatment, and hydrofluoric acid treatment.

FIG. 3B shows the results after isothermal cleaning. There are only minor changes in the EDAX spectrum after isothermal cleaning, since no metals are presumed to be removed by this process.

The hydrochloric acid step (second step) removes transition metals such as Fe, Cr, Ni, as well as other metals that readily form a water soluble metal chloride. FIG. 3C shows EDAX spectra after HCl cleaning, where it can be clearly seen that many of the metals present in the as-received and isothermally cleaned samples in FIGS. 3A and 3B are no longer present, in fact, almost all that remains are Al, Si, S, Cl and small amounts of iron.

In the hydrofluoric acid treatment (third step) of the cleaning process, the remaining non-carbon elements, primarily Al and Si, are removed using hydrofluoric acid. FIG. 3D shows the EDAX spectra after the HF cleaning step, and it can be seen that only carbon and oxygen are left as impurities in the sample.

The above described three-step purification process was designed to remove the carbon impurities (non-$sp^3$ carbon) and inorganic impurities (metal species, oxides, etc.) which are included in commercially available nanodiamonds. The purification process may include (1) isothermal treatment for removal of non-diamond carbon, (2) hydrochloric acid treatment for removal of transition metals, and (3) hydrofluoric acid treatment for removal of remaining non-carbon species, including aluminum, and silicon.

Table 1 summarizes the quantitative EDAX data showing the wt % of species in the nanodiamond powder during different stages of the purifying process, including for the powder as-received, after isothermal heat treatment, after hydrochloric acid treatment, and after hydrofluoric acid treatment. The table shows that the completely cleaned nanodiamond powder substantially does not have any found metals (NF=not found), at the level of 0.01 wt %. The level of 0.01 wt % is arrived at using a high-resolution leading edge EDAX measurement system such as in S-4800 and JEOL 2010F, which has resolution (lowest detection sensitivity) of few atomic %, particularly for elements with atomic number Z>11. Sensitivity of this technique increases with increasing atomic number. Accordingly, as an array of elements with varied atomic numbers are included, the detection limit (lowest detection sensitivity) can be conservatively estimated as 0.01 wt %. This data, together with the EELS data, shows that the major extrinsic sources of color, namely $sp^2$ carbon and metal impurities, have been removed from the nanodiamond to at least the level of 0.01%, and significantly lower in the case of $sp^2$ carbon.

TABLE 1

| Component | Quantitative EDAX data (unit: wt %) | | | |
|---|---|---|---|---|
| | As Received | Isothermal 460° C., 1 hr, Air | HCl treatment | HF treatment |
| S | 1.17-1.35 | 0.8-0.9 | 0.75-0.9 | NF |
| W | 0.25 | 0.24 | NF | NF |
| Ta | 0.18 | 0.19-0.2 | NF | NF |
| Fe | 0.1 | 0.15-0.2 | <0.01 | NF |
| Cr | 0.3-0.5 | 0.5-0.7 | NF | NF |
| Mn | 0.01 | 0.02 | NF | NF |
| Al | 0.01 | 0.08 | 0.1-0.12 | NF |
| Ag | 0.16 | <0.01 | NF | NF |
| Ca | 0.01 | 0.01-0.02 | NF | NF |
| Cu | 0.05 | 0.04 | NF | NF |
| Ti | 0.02 | 0.04 | NF | NF |
| Si | 0.15 | 0.2-0.25 | 0.2-0.35 | NF |
| Cl | 1.1-1.2 | 1.2-1.3 | 0.05 | NF |

Example 2

Figure 4:
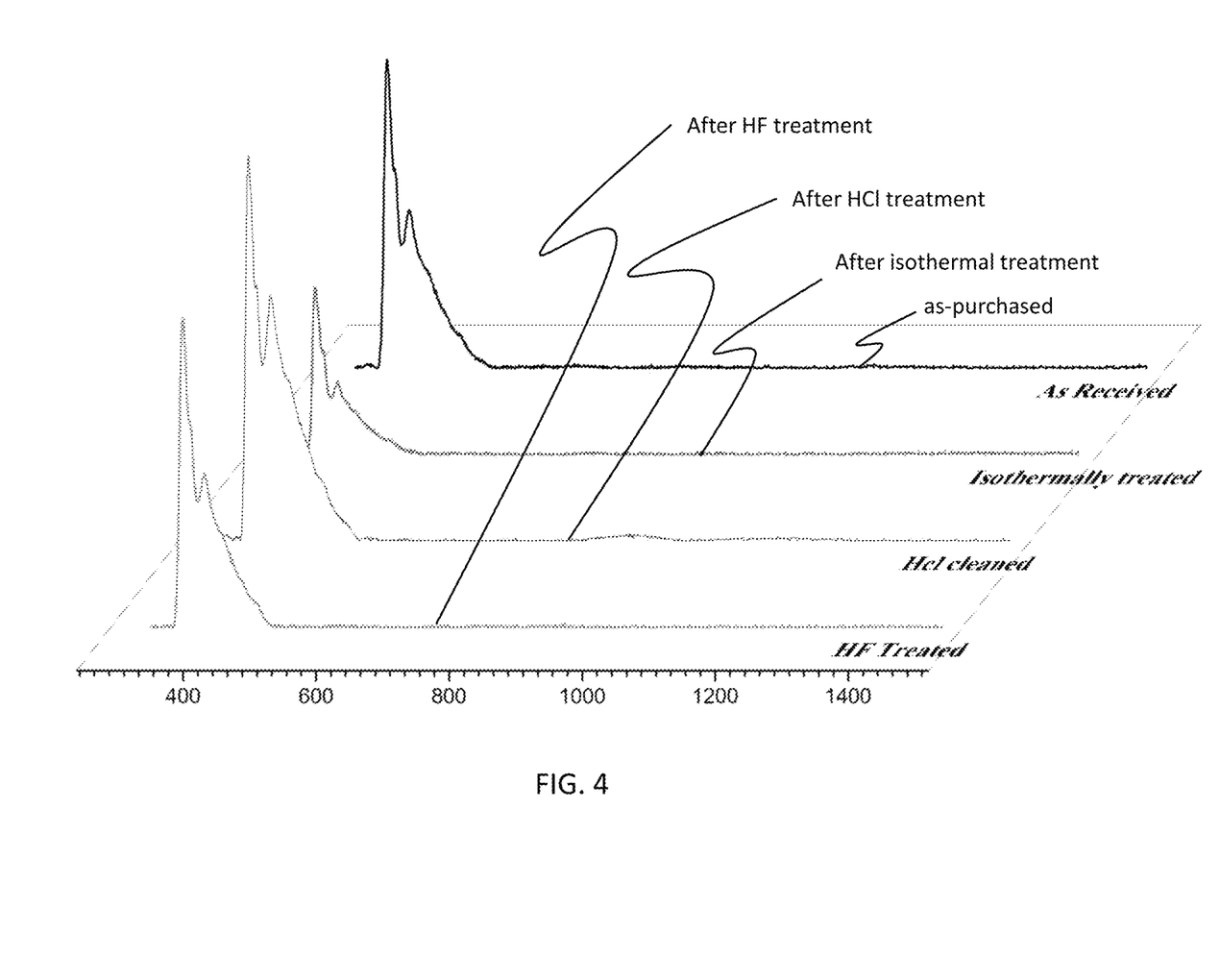
FIG. 4 shows EELS spectra of a nanodiamond powder at different steps in a purification process.

In order to establish that the improved cleaning process does not reintroduce $sp^2$ carbon, a series of EELS measurements were made on nanoparticles taken after each step by using a commercial nanodiamond powder with little or no $sp^2$ C, purchased from Sigma-Aldrich. FIG. 4 shows that, other than overall signal level variation, there is no change in the EELS spectrum during the cleaning process. In FIG. 4, the horizontal line is energy in eV, and the vertical line (not shown) is EEL signal count.

Figure 6A:
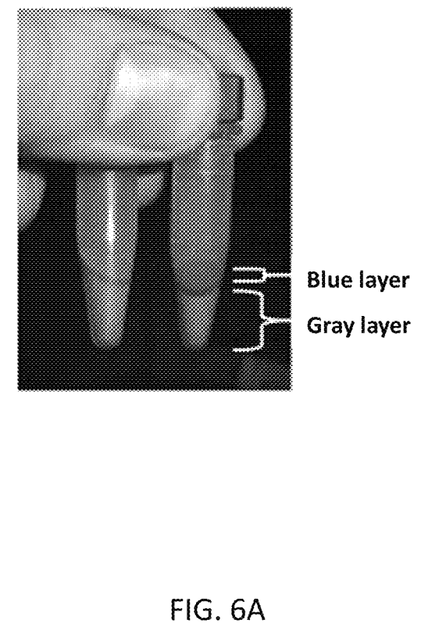
FIG. 6A shows blue and gray nanodiamond powders separated using centrifugation.

After HF cleaning and washing with water, the nanodiamond powder was subjected to centrifugation, upon which the powder separated into two distinct layers, blue on top of gray, as shown in FIG. 6A. Under transmission electron microscopy (TEM) the blue layer was found to contain smaller particles with the least number of particle clusters. The gray was found to contain mostly clusters of particles. Since nanoparticle clusters often exhibit increased optical scattering, the blue layer having fewer clusters is of interest for optical applications, such as in developing high refractive index composites. Purified gray material can also be used for other applications such as sensors or abrasive materials. The blue layer contained smaller particles but also a large range of diameters. To further size purify these particles the blue layer was subjected to the density gradient separation technique, as described above.

Example 3

By using the density gradient technique described above, the nanodiamond powder can be classified as follows.

Figure 6B:
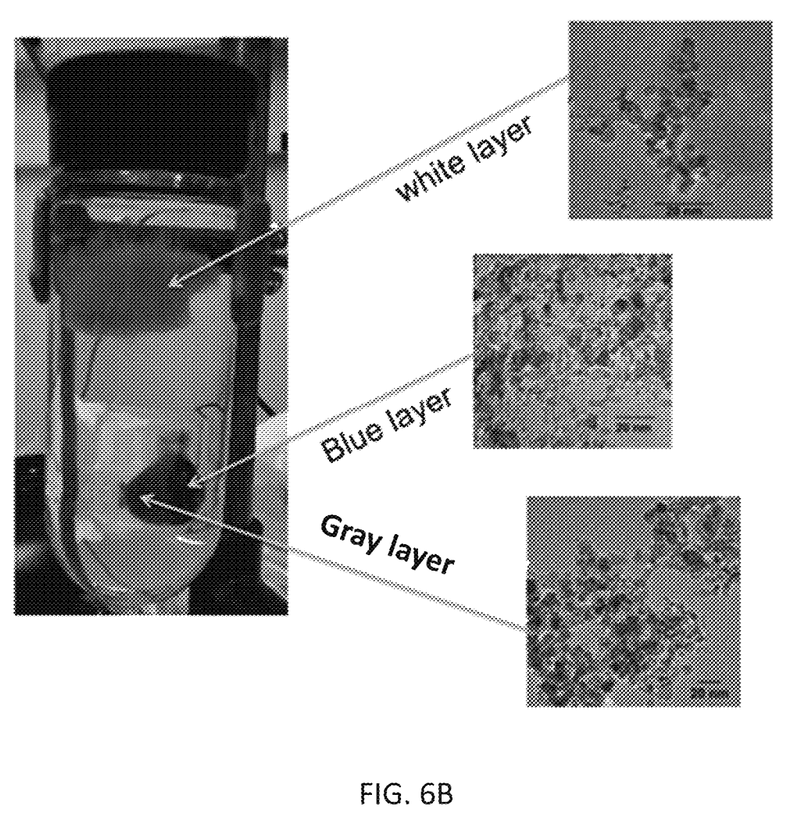
FIG. 6B shows white, blue and gray nanodiamond powders separated using a density gradient separation technique, along with their transmission electron microscopy (TEM) images.

FIG. 6B shows the separated white, blue and gray nanodiamond powders along with their transmission electron microscopy (TEM) images. The white layer (collected from the top in the density gradient method) contained particles with diameter 7±2 nm, and clusters with average diameter of 35±10.2 nm. The blue layer (collected from the bottom layer) contained particles with diameter of 5±4 nm and clusters of 102±60.0 nm. The gray layer, which is very similar to bulk, was found to contain particles with diameter of 5±7 nm and 220±85.0 nm clusters. Thus, the density gradient separation technique allows for the separation of nanodiamond layers according to particle sizes and/or number of particle clusters, such as to allow for isolation of layers having reduced particle sizes and/or reduced numbers of particle clusters. Of the separated layers, the nanodiamond particles recovered from the white layer may provide characteristics suitable for optical applications because of low optical scattering from the smaller particles and the small number of clusters present in the white layer. Particles from the blue layer can also be used for wavelength specific optical applications such as luminescent particles in biological tagging and as sensors. The particles separated from the gray region are very similar to the ones separated from the gray layer following centrifugation as described above, and can be used for similar applications.

A cluster was defined as a collection of individual nanoparticles that are attached to each other in the TEM images, a minimum number of particles that were considered in this estimation of cluster size was 2. TEM images recorded in 300 k magnification were used and at this magnification TEM instrument has ~0.6 nm resolution. Using program ImageJ the pixels were calibrated for the size based on the sale bar printed on each TEM image. A total of 5 sets of TEM images were used for each particle.

Nanodiamonds have been widely used in applications ranging among abrasives, coatings, lubricants, polymer composites, electronic devices, and the biomedical field. Nanodiamonds cleaned according to aspects of the invention can work more effectively for these and other applications than commercial nanodiamonds containing some impurities. Aspects of the invention can provide a high efficiency purification method, as shown above, which yields nanodiamonds that are much purer than nanodiamonds produced by existing cleaning processes.

Despite the removal of $sp^2$ carbon and substantially all measurable metal impurities in the cleaning process, the resulting nanodiamond may remain a light gray color in some cases. Accordingly, further separation of large particles using the disclosed density gradient technique has been shown to be effective in further reducing gray color.

As explained above, $sp^2$ carbon and metal contaminations can be removed to obtain purified nanodiamonds. The purified nanodiamonds can fully demonstrate their bulk character with respect to mechanical properties, chemical stability, optical properties (i.e. high refractive index), electric properties, and thermal conductivity. They can be used as materials for transparent resin, glass, or plastic. For example, the purified nanodiamonds can be used in a glass lens or a plastic lens. Since the content of the metal impurities in the purified nanodiamonds is very low, such purified nanodiamonds can also be used as biomedical materials.

While the embodiments according to the present invention have been described with reference to exemplary embodiments, it is to be understood that the present invention is not limited to the above described embodiments. The scope of the following claims is to be accorded the broadest interpretation so as to encompass all such modifications and equivalent structures and functions.

What is claimed is:

1. A method of purifying a nanodiamond powder comprising: preparing the nanodiamond powder;
heating the nanodiamond powder at between 450° C. and 470° C. in an atmosphere including oxygen to reduce a content of $sp^2$ carbon to less than 0.01 wt %;
after heating the nanodiamond powder to reduce the content of $sp^2$ carbon, performing a hydrochloric acid treatment on the heated nanodiamond powder; and
performing a hydrofluoric acid treatment on the nanodiamond powder obtained after the hydrochloric acid treatment,
wherein a content of S (sulfur), Fe (iron), Al (aluminum) and Si (silicon) is each reduced to less than 0.01 wt %.

2. The purification method according to claim 1, further comprising performing a density gradient separation process to separate the nanodiamond powder according to one or more of particle size and number of particle clusters.

3. The purification method according to claim 1, wherein the nanodiamond powder is heated isothermally at 460° C.

4. The purification method according to claim 1, wherein heating is performed to remove $sp^2$ carbon from the powder, the hydrochloric acid treatment is performed to remove transition metals from the powder, and the hydrofluoric acid treatment is performed to remove aluminum and silicon from the powder.

5. The purification method according to claim 1, wherein performing the hydrochloric acid treatment comprises treating with a first acid solution having a first acid consisting of hydrochloric acid, and wherein performing the hydrofluoric acid treatment comprises treating with a second acid solution having a second acid consisting of hydrofluoric acid.

6. The purification method according to claim 1, wherein heating the nanodiamond powder in the atmosphere including oxygen comprises at least one of: (i) heating in an atmosphere that is air, and (ii) heating in an atmosphere where the oxygen is $O_2$.

7. The purification method according to claim 1, comprising: preparing a nanodiamond powder; removing sp2 carbon from the powder by oxidization; removing transition metals by using a hydrochloric acid treatment; and removing aluminum and silicon by using a hydrofluoric acid treatment.

8. The purification method according to claim 1, wherein the content of S, Fe, Al, and Si in the resulting purified nanodiamond powder is each less than 0.01 wt % as determined by EDAX spectra.

9. The purification method of claim 1, wherein the content of W (tungsten), Ta (tantalum), Cr (chromium), Mn (manganese), Ag (silver), Ca (calcium), Cu (copper), and Ti (titanium) in the resulting purified nanodiamond powder is each less than 0.01 wt %, as determined by EDAX spectra.

10. The purification method of claim 1, wherein, as determined by EDAX spectra, peaks for carbon and oxygen are observed, and peaks for S (sulfur), W (tungsten), Ta (tantalum), Fe (iron), Cr (chromium), Mn (manganese), Al (aluminum), Ag (silver), Ca (calcium), Cu (copper), Ti (titanium), and Si (silicon) are not substantially observed.

\* \* \* \* \*